(12) United States Patent
Kawamoto et al.

(10) Patent No.: US 9,343,522 B2
(45) Date of Patent: May 17, 2016

(54) CERAMIC POWDER, SEMICONDUCTOR CERAMIC CAPACITOR, AND METHOD FOR MANUFACTURING SAME

(71) Applicant: MURATA MANUFACTURING CO., LTD., Nagaokakyo-shi, Kyoto-fu (JP)

(72) Inventors: Mitsutoshi Kawamoto, Nagaokakyo (JP); Atsushi Sano, Nagaokakyo (JP); Tatsuya Ishikawa, Nagaokakyo (JP); Yasutomo Kobayashi, Nagaokakyo (JP); Yoshihiro Fujita, Nagaokakyo (JP); Yuki Kimura, Nagaokakyo (JP); Yuichi Kusano, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 0 days.

(21) Appl. No.: 14/100,116

(22) Filed: Dec. 9, 2013

(65) Prior Publication Data

US 2014/0091432 A1 Apr. 3, 2014

Related U.S. Application Data

(63) Continuation of application No. PCT/JP2012/065451, filed on Jun. 18, 2012.

(30) Foreign Application Priority Data

Jun. 22, 2011 (JP) ................................. 2011-138660

(51) Int. Cl.
*H01L 21/02* (2006.01)
*H01L 49/02* (2006.01)

(Continued)

(52) U.S. Cl.
CPC ................. *H01L 28/55* (2013.01); *B82Y 30/00* (2013.01); *C04B 35/47* (2013.01); *H01G 4/1227* (2013.01);

(Continued)

(58) Field of Classification Search
CPC .... C04B 35/4682; C04B 35/47; H01L 28/55; H01G 4/1227; H01G 4/30; B82Y 30/00
USPC ............................. 257/532; 438/396; 428/402
See application file for complete search history.

(56) References Cited

U.S. PATENT DOCUMENTS

| 7,583,493 | B2 * | 9/2009 | Tani et al. ................... 361/321.4 |
| 8,450,230 | B2 * | 5/2013 | Tamura et al. ................. 501/139 |

(Continued)

FOREIGN PATENT DOCUMENTS

| CN | 1417815 A | 5/2003 |
| CN | 101346325 A | 1/2009 |

(Continued)

OTHER PUBLICATIONS

PCT/JP2012/065451 Written Opinion dated Sep. 7, 2012.

(Continued)

*Primary Examiner* — Colleen A Matthews
*Assistant Examiner* — Colleen E Snow
(74) *Attorney, Agent, or Firm* — Arent Fox LLP

(57) ABSTRACT

A ceramic powder for use in a grain boundary insulated semiconductor ceramic that has an excellent ESD withstanding voltage, a semiconductor ceramic capacitor using the ceramic powder, and a manufacturing method therefor. The ceramic powder for use in a $SrTiO_3$ based grain boundary insulated semiconductor ceramic has a specific surface area of 4.0 $m^2/g$ or more and 8.0 $m^2/g$ or less, and a cumulative 90% grain size D90 of 1.2 μm or less.

11 Claims, 1 Drawing Sheet

(51) Int. Cl.
*C04B 35/47* (2006.01)
*H01G 4/30* (2006.01)
*H01G 4/12* (2006.01)
*B82Y 30/00* (2011.01)

(52) U.S. Cl.
CPC .......... *H01G 4/30* (2013.01); *C04B 2235/3227* (2013.01); *C04B 2235/3262* (2013.01); *C04B 2235/3418* (2013.01); *C04B 2235/5409* (2013.01); *C04B 2235/5436* (2013.01); *C04B 2235/5445* (2013.01); *C04B 2235/5454* (2013.01); *C04B 2235/5463* (2013.01); *C04B 2235/6025* (2013.01); *C04B 2235/652* (2013.01); *C04B 2235/6583* (2013.01); *C04B 2235/6586* (2013.01); *Y10T 428/2982* (2015.01)

(56) References Cited

U.S. PATENT DOCUMENTS

2001/0035563 A1* 11/2001 Masumiya et al. ........... 257/532
2004/0233612 A1* 11/2004 Sugimoto et al. ............. 361/312
2007/0109720 A1* 5/2007 Kamei ...................... 361/321.2
2008/0117561 A1* 5/2008 Tani et al. ..................... 361/311
2008/0186655 A1 8/2008 Kawamoto
2009/0264276 A1* 10/2009 Yamashita et al. ............ 501/138
2010/0103587 A1 4/2010 Kawamoto
2011/0164346 A1* 7/2011 Tamura et al. .............. 361/321.1
2011/0183834 A1* 7/2011 Tanabe .................... H01B 3/12
501/139

FOREIGN PATENT DOCUMENTS

| JP | 3-059907 A | 3/1991 |
| JP | 2002-134350 A | 5/2002 |
| JP | 2004-022611 | 1/2004 |
| WO | WO-2008/004389 A1 | 1/2008 |
| WO | WO-2009-001690 A1 | 12/2008 |

OTHER PUBLICATIONS

PCT/JP2012/065451 ISR dated Sep. 7, 2012.

* cited by examiner

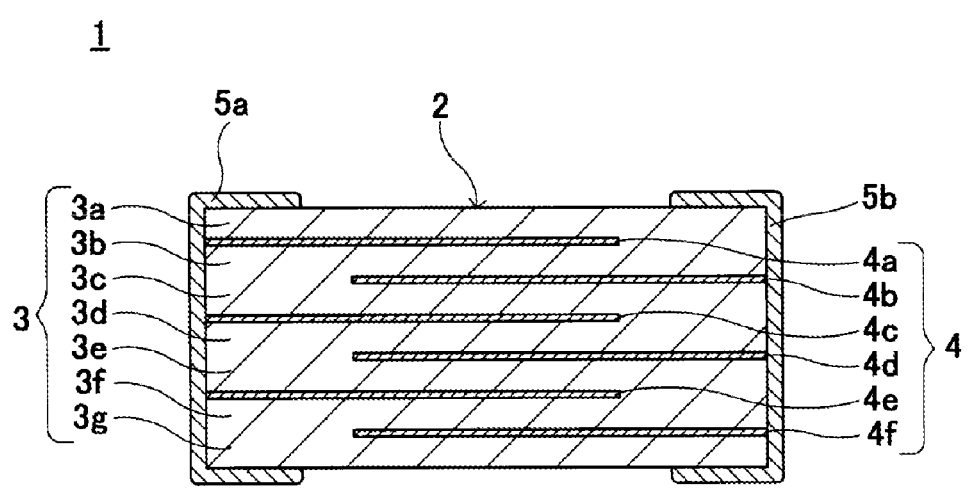

CERAMIC POWDER, SEMICONDUCTOR CERAMIC CAPACITOR, AND METHOD FOR MANUFACTURING SAME

CROSS REFERENCE TO RELATED APPLICATIONS

The present application is a continuation of International application No. PCT/JP2012/065451, filed Jun. 18, 2012, which claims priority to Japanese Patent Application No. 2011-138660, filed Jun. 22, 2011, the entire contents of each of which are incorporated herein by reference.

FIELD OF THE INVENTION

The present invention relates to a ceramic powder, more particularly, a ceramic powder for use in a $SrTiO_3$ based grain boundary insulated semiconductor ceramic, a semiconductor ceramic capacitor using the ceramic powder, and a manufacturing method therefor.

BACKGROUND OF THE INVENTION

In recent years, with the development of electronics technology, mobile electronic devices such as cellular phones and laptop personal computers, and in-car electronic devices to be installed on cars have becoming common, and the reduction in size with multiple functions has been required for the electronic devices. On the other hand, in order to achieve the reduction in size with multiple functions for the electronic devices, more semiconductor elements have been used such as various types of ICs and LSICs, and accordingly, there have been a need for measures against noises from the electronic devices.

As the measures against noises from the electronic devices, power lines for semiconductor elements are provided with a film capacitor, a laminate-type ceramic capacitor, a semiconductor ceramic capacitor, or the like as a bypass capacitor. In particular, in the case of car navigation systems, car audio systems, in-car ECUs, etc., it is common that a capacitor with an electrostatic capacitance on the order of 1 nF is connected to an external terminal to absorb high-frequency noises.

However, the electrostatic capacitance lowered on the order of 1 nF makes the ESD (Electro-Static Discharge) withstanding voltage extremely low (for example, on the order of 2 kV to 4 kV), thereby possibly leading to breakdown of the capacitor itself. Therefore, as a measure against ESD, it is often the case that a varistor or a zener diode is used in parallel connection to the capacitor.

On the other hand, $SrTiO_3$ based grain boundary insulated semiconductor ceramics are known to have varistor characteristics. The varistor characteristics refer to characteristics of large currents which flow when voltages of not less than a certain value are applied. The use of the varistor characteristics eliminates the need for connections to varistors or zener diodes as in the case of conventional capacitors, and thus can provide capacitors which have the function of an ESD withstanding voltage by themselves.

Therefore, the development of capacitors using these grain boundary insulated semiconductor ceramics has been advanced.

For example, Patent Document 1 discloses a $SrTiO_3$ based grain boundary insulated ceramic powder that has a donor element in crystal grain boundaries as a solid solution, also an acceptor element present at least in the crystal grain boundaries, an integral width of 0.500° or less at the crystal face (222), and an average powder grain size of 1.0 μm or less for the crystal grains. In addition, semiconductor ceramic capacitors prepared with the use of a semiconductor ceramic obtained by firing the ceramic powder are considered to be able to prevent the capacitor itself from being destroyed, even when high voltages are applied.

Patent Document 1: International Publication No. WO 2009/001690

SUMMARY OF THE INVENTION

However, semiconductor ceramic capacitors actually prepared with the use of the semiconductor ceramic described in Patent Document 1 have the problem of the ESD withstanding voltage decreased under certain conditions. The present inventors have advanced the research on this problem to find that the powder characteristic of the unfired ceramic powder has a significant influence on the ESD withstanding voltage of the semiconductor ceramic capacitor. More specifically, it has been revealed that when the ceramic powder contains coarse grains, the fired semiconductor ceramic has coarse grains produced, and as a result, the semiconductor ceramic capacitor undergoes a decrease in ESD withstanding voltage.

The present invention has been achieved in terms of these circumstances, and an object of the present invention is to provide a ceramic powder for providing a grain boundary insulated semiconductor ceramic that has an excellent ESD withstanding voltage, a semiconductor ceramic capacitor using the ceramic powder, and a manufacturing method therefor.

The ceramic powder according to the present invention is a ceramic powder for use in a $SrTiO_3$ based grain boundary insulated semiconductor ceramic, the ceramic powder having a specific surface area of 4.0 $m^2/g$ or more and 8.0 $m^2/g$ or less, and a cumulative 90% grain size D90 of 1.2 μm or less.

Furthermore, the present invention is also directed to a semiconductor ceramic capacitor provided with: a laminated body including a plurality of semiconductor layers stacked and a plurality of internal electrodes containing Ni as their main constituent, which are formed along the interfaces between the semiconductor ceramic layers; and external electrodes provided on both ends of the laminated body and electrically connected to the internal electrode, wherein the semiconductor ceramic layers include the ceramic powder subjected to sintering.

Furthermore, the present invention is also directed to a method for manufacturing a semiconductor ceramic capacitor, which includes: a calcined powder preparation step of preparing a calcined powder in such a way that a compound containing Sr, a compound containing Ti, and a compound containing a donor element are subjected to mixing and grinding, and then calcination; a mixed powder preparation step of preparing a mixed powder in such a way that the calcined powder and a compound containing an acceptor element are subjected to mixing and grinding, and then a heat treatment; a ceramic green sheet preparation step of mixing the mixed powder and a binder to prepare ceramic slurry, and preparing, from the ceramic slurry, ceramic green sheets to serve as semiconductor ceramic layers, which contain the ceramic powder and the binder; a forming step of preparing a compact in such a way that a conductive paste to serve as internal electrodes is applied to some surfaces of the ceramic green sheets, and the ceramic green sheets are then stacked, and subjected to pressure bonding; and a firing step of preparing a laminated body in such a way that the compact is subjected to primary firing under a reducing atmosphere, and then secondary firing under an air atmosphere, wherein the ceramic powder in the ceramic green sheets has a specific surface area of 4.0 m²/g or more and 8.0 m²/g or less, and a cumulative 90% grain size D90 of 1.2 μm or less.

In addition, in the method for manufacturing a semiconductor ceramic capacitor according to the present invention, the calcination temperature in the calcined powder preparation step is preferably 1300 to 1450° C., and the firing temperature for the primary firing in the firing step is preferably 1150 to 1250° C.

According to the present invention, it is possible to achieve a semiconductor ceramic capacitor that has a high ESD withstanding voltage.

BRIEF EXPLANATION OF THE DRAWING

The FIGURE is a cross-sectional view schematically illustrating a semiconductor ceramic capacitor according to an embodiment of the present invention.

DETAILED DESCRIPTION OF THE INVENTION

An embodiment for carrying out the present invention will be described below.

The FIGURE is a cross-sectional view schematically illustrating a semiconductor ceramic capacitor according to an embodiment of the present invention.

A semiconductor ceramic capacitor 1 includes a laminated body 2, and external electrodes 5a, 5b provided on both ends of the laminated body.

The laminated body 2 includes: a plurality of semiconductor ceramic layers 3a to 3g stacked, and a plurality of internal electrodes 4a to 4f containing Ni as their main constituent, which are formed along the interfaces between the semiconductor ceramic layers 3a to 3g. The internal electrodes 4a, 4c, 4e are exposed at one end surface of the laminated body 2, and electrically connected to an external electrode 5a. In addition, the internal electrodes 4b, 4d, 4f are exposed at the other end surface of the laminated body 2, and electrically connected to an external electrode 5b.

The semiconductor ceramic layers 3a to 3g have a grain boundary insulated semiconductor ceramic including crystal grains and crystal grain boundaries formed around the crystal grains. The grain boundary insulated semiconductor ceramic is intended to form electrostatic capacitance in such a way that the compact is made semiconductive by primary firing under a reducing atmosphere, and then the crystal grain boundaries are made insulative by secondary firing under an oxidizing atmosphere.

In addition, the semiconductor ceramic layers 3a to 3g contain a $SrTiO_3$ based ceramic as their main constituent, and contain a donor element and an acceptor element. Some of Sr may be substituted with Ba, Ca, or the like. In addition, some of Ti may be substituted with Zr or the like.

The donor element is partially present as a solid solution in the crystal grains. In addition, when the acceptor element is partially present at the grain boundaries, oxygen is adsorbed to the crystal grain boundaries by the acceptor element during the secondary firing. Thus, the crystal grain boundaries can be made insulative progressively to make an improvement in dielectric constant.

The ceramic powder according to the present invention is used for the $SrTiO_3$ based grain boundary insulated semiconductor ceramic described above, and the semiconductor ceramic layers 3a to 3g include the ceramic powder subjected to sintering. This ceramic powder has a specific surface area of 4.0 m²/g or more and 8.0 m²/g or less, and a cumulative 90% grain size D90 of 1.2 μm or less. The adjustment of the specific surface area and cumulative 90% grain size D90 as described above makes it possible to suppress coarsening of the crystal grains after firing the ceramic powder. Therefore, a semiconductor ceramic capacitor can be achieved which has an excellent ESD withstanding voltage.

It is to be noted that while the ratio between Sr and Ti is not to be considered particularly limited, the Sr/Ti ratio is preferably 0.990 or more and 1.010 or less. The semiconductor ceramic layers 3a to 3g have a particularly favorable insulating property in this range, and also have a favorable ESD withstanding voltage.

In addition, the molar content of the donor element is not to be considered particularly limited, but is 0.2 to 1.2 mol, preferably 0.4 to 1.0 mol with respect to 100 mol of Ti. Within this range, the semiconductor ceramic capacitor achieves particularly favorable electrostatic capacitance. Examples of the donor element include rare-earth elements such as La, Sm, Dy, Ho, Y, Nd, and Ce, and Nb, Ta, and W.

In addition, the molar content of the acceptor element is not to be considered particularly limited, but is 0.7 mol or less (however, excluding 0 mol), preferably 0.3 to 0.5 mol with respect to 100 mol of Ti. Within this range, the semiconductor ceramic capacitor achieves particularly favorable electrostatic capacitance. Examples of the acceptor element include transition metals such as Mn, Co, Ni, and Cr.

Moreover, the semiconductor ceramic layers 3a to 3g may contain therein a low melting oxide such as $SiO_3$, $B_2O_3$, and glass ceramics containing an alkali metal element.

Next, a method for producing the semiconductor ceramic capacitor will be described.

Initially, a compound including Sr, a compound containing Ti, and a compound containing a donor element are each prepared, and weighed in predetermined amounts.

Next, these weighed compounds with a predetermined amount of dispersant added are put in a ball mill, along with a grinding medium such as PSZ (Partially Stabilized Zirconia) balls, and pure water. Then, the weighed compounds are mixed in a wet way to prepare slurry. Then, this slurry is dried, and then subjected to calcination at, for example, 1300 to 1450° C. under an air atmosphere to prepare a calcined powder.

Next, a compound containing an acceptor element is prepared, and weighed in a predetermined amount. If necessary, a low melting oxide such as $SiO_2$ may be prepared, and weighed in predetermined amounts. Then, put in a ball mill are the calcined powder, the compound containing the acceptor raw material, the low melting oxides, pure water, and a dispersant. Then, this mixture is mixed in a wet way, and then subjected to evaporative drying. Then, a heat treatment is carried out at a predetermined temperature under an air atmosphere to prepare a mixed powder.

Next, this mixed powder is sufficiently mixed in a wet way, appropriately with the addition of an organic solvent such as toluene and ethanol, a binder, a plasticizer, a surfactant, etc. thereto, to obtain ceramic slurry.

Next, ceramic green sheets are prepared from the ceramic slurry. The ceramic green sheets contain the ceramic powder and a binder, which are subjected to firing to serve as semiconductor ceramic layers. Examples of the method for preparing the ceramic green sheets include a doctor blade method, a lip coater method, and a die coater method.

Next, a conductive paste to serve as internal electrodes is applied to some surfaces of the ceramic green sheets. Examples of the application method include a screen printing and a gravure printing method.

Next, the ceramic green sheets are stacked, subjected to pressure bonding, and then cut into a predetermined size to prepare a compact.

Next, the compact is heated under an air atmosphere to carry out a binder removal treatment. The temperature condition for the binder removal treatment is, for example, 300 to 500° C. Then, the compact is subjected to primary firing in a reducing atmosphere at a predetermined flow ratio between $H_2$ gas and $N_2$ gas (for example, $H_2/N_2$=0.025/100 to 1/100 in terms of volume ratio). The firing temperature for the primary temperature is preferably 1150° C. to 1250° C. As described above, the firing temperature for the primary firing lower than the calcination temperature (1300 to 1450° C.) suppresses the grain growth of the crystal grains in the primary firing, thus making it possible to prevent coarsening of the crystal grains. Thereafter, secondary firing is carried out under an air atmosphere to prepare a laminated body. The firing temperature for the secondary firing is, for example, 600 to 900° C.

Next, a conductive paste is applied by a dip method to both ends of the laminated body. Thereafter, a baking treatment is carried out to form external electrodes. The method for forming the external electrodes may be a printing method, a vacuum deposition method, or a sputtering method. In this way, a semiconductor ceramic capacitor is manufactured.

It is to be noted that the present invention is not to be considered limited to the embodiment described above, and allows for various embodiments without undermining the advantageous effect of the present invention.

Experimental Example

Next, an experimental example of the present invention will be described specifically.

(Preparation of Sample)

Prepared were $SrCO_3$ as the compound containing Sr, $TiO_2$ with a specific surface area of 30 m$^2$/g (average grain size: about 30 nm) as the compound containing Ti, and $LaCl_3$ as the donor compound. Then, the compounds were weighed so that the content of $LaCl_3$ was 0.8 mol with respect to 100 mol of the Ti element. The molar ratio between Sr and Ti (Sr/Ti ratio) was adjusted to 1.000.

Next, 3 parts by weight of ammonium polycarboxylate was added as a dispersant with respect to 100 parts by weight of the weighed compounds. These weighed compounds and the dispersant were put in a ball mill along with PSZ balls of 2 mm in diameter as a powder medium, and pure water. Then, wet mixing was carried out in the ball mill to prepare ceramic slurry.

Next, this ceramic slurry was subjected to evaporative drying, and then calcination at 1400° C. for 2 hours to obtain a calcined powder.

Next, $MnCO_3$ as the compound containing the acceptor element, $SiO_2$ as a low melting compound, and ammonium polycarboxylate as a dispersant were added to the calcined powder. Then, the mixture was put in a ball mill along with PSZ balls of 2 mm in diameter and pure water, and subjected to wet mixing in the ball mill. In this case, the additive amount of ammonium polycarboxylate and the mixing time were adjusted to the conditions as shown in Table 1. In addition, $MnCO_3$ was added in a molar ratio of Mn/Ti=0.003. In addition, $SiO_2$ was added in a molar ratio of Si/Ti=0.001.

Thereafter, the obtained slurry was taken out, and subjected to evaporative drying. Thereafter, a heat treatment was carried out at a temperature of 600° C. for 5 hours to remove a dispersant component, thereby providing a mixed powder.

Next, an organic solvent such as toluene and alcohol, and a dispersant were added to the mixed powder, which was put into a ball mill along with PSZ balls of 2 mm in diameter. Then, wet mixing was carried out in the ball mill. Thus, ceramic slurry was prepared.

Next, ceramic green sheets were prepared from the ceramic slurry by a lip coater method.

Next, a conductive paste containing Ni as its main constituent was applied to surfaces of the ceramic green sheets. Then, outer layers (layers with no conductive paste printed) were provided on the top and bottom of a configuration provided so that the layer number of ceramic green sheets of the configuration was 10, stacked in a thickness on the order of 0.7 mm in total, and subjected to pressure bonding. Then, the block body obtained by the pressure bonding was cut into a predetermined shape to obtain a compact.

Next, a heat treatment at 400° C. for 2 hours was carried out in the air to degrease the compact. After the completion of the degreasing, primary firing under the condition of 1200° C. for 2 hours was carried out under a reducing atmosphere of $H_2/N_2$=0.1/100 to 1/100. Thereafter, secondary firing was carried out under the condition of 700° C. for 1 hour in the air to obtain a laminated body. The laminated body obtained was approximately 1.0 mm (L)×0.5 mm (W)×0.5 mm (T) in dimensions.

Thereafter, external electrodes were formed by a sputtering method. The external electrodes were configured to have a three-layer structure of a first layer: NiCr (nichrome), a second layer: monel, and a third layer: Ag. Thereafter, the surfaces of the external electrodes were subjected to Ni plating and Sn plating, thereby completing a semiconductor ceramic capacitor of size 1005.

(Evaluation of Sample)

The specific surface area and cumulative 90% grain size D90 of the ceramic powder were measured after removing organic components such as the binder in the ceramic green sheets by a heat treatment.

The specific surface area was measured by the BET method with the use of a laser diffraction/scattering-type grain size distribution measuring apparatus LA-700 manufactured by Horiba, Ltd.

The cumulative 90% grain size D90 was measured with a specific surface area measuring apparatus Macsorb Model HM-1220 manufactured by Mountech Co., Ltd., and the grain size for 90% of the cumulative grain size distribution on the volumetric basis was determined from the obtained grain size distribution.

The electrostatic capacitance of the semiconductor ceramic capacitor was measured under the conditions of 1 kHz and 1 V. In addition, the insulation resistance was measured by applying DS 50 V for 1 minute. Furthermore, the ESD withstanding voltage was measured by applying each of forward and reverse voltages 10 times each with contact discharge in operation, on the basis of IEC61000-4-2 standards.

Table 1 shows the additive amount of dispersant and the mixing time for the calcined powder, the specific surface area and cumulative 90% grain size D90 of the ceramic powder, and the electrostatic capacitance, insulation resistance, and ESD withstanding voltage of the semiconductor ceramic capacitor.

TABLE 1

| | Manufacturing Condition | | Ceramic Powder | | Semiconductor Ceramic Capacitor | | |
|---|---|---|---|---|---|---|---|
| Sample Number | Additive Amount of Dispersant (wt %) | Mixing Time (hour) | Specific Surface Area ($m^2/g$) | Cumulative 90% Grain Size D90 ($\mu m$) | Electrostatic Capacitance (nF) | Insulation Resistance log R ($\Omega$) | ESD Withstanding Voltage (kV) |
| 1* | 0 | 16 | 2.7 | 2.10 | 1.81 | 7.3 | 4 |
| 2* | 0 | 24 | 3.2 | 1.82 | 1.64 | 7.5 | 6 |
| 3* | 0 | 32 | 3.5 | 1.62 | 1.75 | 7.5 | 8 |
| 4* | 0 | 48 | 4.0 | 1.43 | 1.31 | 7.8 | 8 |
| 5* | 0 | 64 | 4.6 | 1.28 | 1.25 | 7.8 | 15 |
| 6* | 1 | 16 | 2.9 | 1.35 | 1.73 | 8.0 | 4 |
| 7* | 1 | 24 | 3.6 | 1.18 | 1.73 | 7.4 | 8 |
| 8 | 1 | 32 | 4.3 | 1.06 | 1.23 | 8.6 | 30 |
| 9 | 1 | 48 | 6.4 | 0.91 | 1.25 | 8.8 | 30 |
| 10* | 1 | 64 | 8.3 | 0.80 | 1.65 | 6.9 | 15 |
| 11 | 3 | 16 | 4.2 | 1.10 | 1.23 | 8.4 | 30 |
| 12 | 3 | 24 | 5.8 | 0.98 | 1.27 | 8.9 | 30 |
| 13 | 3 | 32 | 6.8 | 0.85 | 1.35 | 8.7 | 30 |
| 14* | 3 | 48 | 8.4 | 0.74 | 1.69 | 7.0 | 15 |

Sample numbers 1 to 3 are small in specific surface area from 2.7 to 3.5 $m^2/g$, and low in ESD withstanding voltage from 4 to 8 kV. In addition, sample numbers 1 to 5 have a cumulative 90% grain size D90 from 1.28 $\mu m$ to 2.10 $\mu m$, and low in ESD withstanding voltage from 4 to 15 kV.

Sample numbers 6 and 7 have a specific surface area from 2.9 to 3.6 $m^2/g$. In addition, sample number 6 has a large cumulative 90% grain size D90 of 1.35 $\mu m$. In this case, sample numbers 6 and 7 are low in ESD withstanding voltage from 4 to 8 kV.

Sample numbers 10 and 14 have a specific surface area from 8.3 to 8.4 $m^2/g$, and a low ESD withstanding voltage of 15 kV.

On the other hand, sample numbers 8, 9, and 11 to 13 have a specific surface area from 4.0 to 8.0 $m^2/g$, and a cumulative 90% grain size D90 of 1.20 $\mu m$ or less. In this case, the ESD withstanding voltage of 30 kV has been achieved as a favorable result.

DESCRIPTION OF REFERENCE SYMBOLS 1 semiconductor ceramic capacitor
2 laminated body
3 semiconductor ceramic layer
4 internal electrode
5 external electrode

The invention claimed is:

1. A semiconductor ceramic capacitor comprising:
a laminated body comprising a plurality of semiconductor ceramic layers and a plurality of internal electrodes containing Ni as their main constituent, the internal electrodes located along interfaces between adjacent semiconductor ceramic layers of the plurality of semiconductor ceramic layers; and
external electrodes on opposed ends of the laminated body and electrically connected to respective sets of the plurality of internal electrodes,
wherein the semiconductor ceramic layers comprise, before sintering, a $SrTiO_3$ ceramic powder having a specific surface area of 4.0 $m^2/g$ or more and 8.0 $m^2/g$ or less, and a cumulative 90% grain size D90 of 1.2 $\mu m$ or less.

2. The semiconductor ceramic capacitor according to claim 1, wherein a ratio between Sr and Ti is 0.990 or more and 1.010 or less in the $SrTiO_3$ ceramic powder.

3. The semiconductor ceramic capacitor according to claim 1, further comprising a donor element in the $SrTiO_3$ ceramic powder.

4. The semiconductor ceramic capacitor according to claim 3, wherein a molar content of the donor element is 0.2 to 1.2 mol with respect to 100 mol of Ti.

5. The semiconductor ceramic capacitor according to claim 3, wherein a molar content of the donor element is 0.4 to 1.0 mol with respect to 100 mol of Ti.

6. The semiconductor ceramic capacitor according to claim 3, wherein the donor element is selected from the group consisting of La, Sm, Dy, Ho, Y, Nd, and Ce, and Nb, Ta, and W.

7. The semiconductor ceramic capacitor according to claim 3, further comprising an acceptor element in the $SrTiO_3$ ceramic powder.

8. The semiconductor ceramic capacitor according to claim 7, wherein a molar content of the acceptor element is 0.7 mol or less and greater than 0 mol with respect to 100 mol of Ti.

9. The semiconductor ceramic capacitor according to claim 7, wherein a molar content of the acceptor element is 0.3 to 0.5 mol with respect to 100 mol of Ti.

10. The semiconductor ceramic capacitor according to claim 7, wherein the acceptor element is selected from the group consisting of Mn, Co, Ni, and Cr.

11. The semiconductor ceramic capacitor according to claim 7, wherein a molar content of the donor element is 0.2 to 1.2 mol with respect to 100 mol of Ti, and a molar content of the acceptor element is 0.7 mol or less and greater than 0 mol with respect to 100 mol of Ti.

* * * * *